United States Patent [19]
Abraham

[11] Patent Number: 6,004,884
[45] Date of Patent: *Dec. 21, 1999

[54] METHODS AND APPARATUS FOR ETCHING SEMICONDUCTOR WAFERS

[75] Inventor: Susan C. Abraham, San Jose, Calif.

[73] Assignee: Lam Research Corporation, Fremont, Calif.

[ * ] Notice: This patent is subject to a terminal disclaimer.

[21] Appl. No.: 08/602,251

[22] Filed: Feb. 15, 1996

[51] Int. Cl.$^6$ .................................................. H01L 21/302
[52] U.S. Cl. .......................... 438/714; 438/738; 438/742; 438/952; 216/72
[58] Field of Search ............... 216/72; 438/714, 438/720, 738, 742, 952

[56] References Cited

U.S. PATENT DOCUMENTS

| | | | |
|---|---|---|---|
| 4,267,012 | 5/1981 | Pierce et al. | 156/643 |
| 4,740,485 | 4/1988 | Sharpe-Geisler | 437/246 |
| 4,820,611 | 4/1989 | Arnold et al. . | |
| 4,878,994 | 11/1989 | Jucha et al. | 156/643 |
| 4,980,018 | 12/1990 | Mu et al. | 156/643 |
| 5,256,245 | 10/1993 | Keller et al. | 156/643 |
| 5,286,675 | 2/1994 | Chen et al. . | |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,399,237 | 3/1995 | Keswick et al. . | |
| 5,411,631 | 5/1995 | Hori et al. | 216/72 |
| 5,429,070 | 7/1995 | Campbell et al. | 118/723 |
| 5,443,941 | 8/1995 | Bariya et al. | 430/313 |
| 5,496,762 | 3/1996 | Sandhu et al. | 437/60 |
| 5,522,520 | 6/1996 | Kawamoto | 216/62 |
| 5,540,812 | 7/1996 | Kadamura | 156/652.1 |
| 5,545,289 | 8/1996 | Chen et al. | 156/643.1 |
| 5,550,085 | 8/1996 | Liu . | |
| 5,562,801 | 10/1996 | Nulty | 156/643.1 |
| 5,609,775 | 3/1997 | Liu | 216/77 |
| 5,620,615 | 4/1997 | Keller | 438/720 |
| 5,665,641 | 9/1997 | Shen et al. . | |
| 5,772,906 | 6/1998 | Abraham | 216/72 |

FOREIGN PATENT DOCUMENTS

| | | | |
|---|---|---|---|
| 489 407 A2 | 6/1992 | European Pat. Off. | H01L 37/32 |
| 622 477 A1 | 11/1994 | European Pat. Off. | C23F 4/00 |
| 3842758 | 6/1990 | Germany | H01L 21/90 |

OTHER PUBLICATIONS

Riley, P; Holbert, R; Kavari, R; and Lujan, L., "Composite metal etching for submicron integrated circuits" Extended Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomomena, vol. 10, No. 5, Oct. 1992, pp. 2133–2147.

Patent Abstracts of Japan, vol. 95, No. 6, Jul. 31, 1995.

T.H. Ahn, S.W. Nam, K.J. Min, and C. Chung,"Effect of Residual Gases on Residue Formation during Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

*Primary Examiner*—John Goodrow
*Attorney, Agent, or Firm*—Beyer & Weaver, LLP

[57] ABSTRACT

A method for etching a TiN layer of a wafer stack in a plasma processing chamber. The method includes the step of etching at least partially through the TiN layer using a first chemistry, which preferably includes a TiN etchant, a noble gas, and a polymer-forming chemical. In one embodiment, the TiN etchant is $Cl_2$, the noble gas is argon, and the polymer-forming chemical is $CHF_3$.

21 Claims, 6 Drawing Sheets

METHODS AND APPARATUS FOR ETCHING SEMICONDUCTOR WAFERS

BACKGROUND OF THE INVENTION

The present invention relates to the fabrication of semiconductor integrated circuits (IC's). More particularly, the present invention relates to methods and apparatus for etching through an IC's layer stack, including the titanium-containing layer, during IC fabrication.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form the desired circuit. To facilitate discussion, FIG. 1 illustrates a cross-section view of a layer stack 20, representing the layers formed during the fabrication of a typical semiconductor IC. It should be noted that other additional layers above, below, or between the layers shown may be present. Further, not all of the shown layers need necessarily be present and some or all may be substituted by other different layers.

At the bottom of layer stack 20, there is shown a wafer 100. An oxide layer 102, typically comprising $SiO_2$, is formed above wafer 100. A barrier layer 104, typically formed of a titanium-containing layer such as Ti, TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al—Cu, Al—Si, or Al—Cu—Si. The remaining two layers of FIG. 1, i.e., an anti-reflective coating (ARC) layer 108 and an overlaying photoresist (PR) layer 110, are then formed atop metallization layer 106. The ARC layer 108, typically comprising another titanium-containing layer such as TiN or TiW, helps prevent light (e.g., from the lithography step that patterns the photoresist) from being reflected and scattered off the surface of the metallization layer 106 and may, in some cases, inhibit hillock growth.

Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, e.g., metallization layer 106, are etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask are then etched away, leaving behind metallization interconnect lines or features.

For illustration purposes, FIG. 2 shows a cross-section view of layer stack 20 of FIG. 1 after conventional etching is completed. In this example, the metallic interconnect lines are represented by the unetched portions of metallization layer 106.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu m$) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in the wider, open field regions. This phenomenon, referred herein as the loading in etch rates, may be a consequence of microloading and aspect ratio dependent etching (ARDE). Microloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates among trenches that are located in areas of similar trench density and among trenches that have different aspect ratios. The loading in etch rates causes trenches to be formed in the layer stack at different rates. The loading in etch rates becomes more severe when trench widths fall below about 0.5 microns, and especially when trench widths fall below about 0.35 microns. As a result of the etch rate variations, by the time metal etching is complete in areas having a slow etch rate (e.g., in the narrower line spacings), overetching, i.e., the inadvertent removal of materials from underlying layers, may already occur in areas having a higher etch rate (e.g., the open field regions).

With reference to FIG. 2, area 120 represents the open field region where the metallization layer is overetched (by distance d1), and area 122 represents the underetched area, where the metallization is underetched (by distance d2). If the etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

In the prior art, the TiN ARC layer, the aluminum metallization layer, and the TiN barrier layer are typically etched using a single chemistry, e.g., $Cl_2/BCl_3$. $Cl_2/BCl_3$ typically etches through the aluminum metallization layer at a faster rate than it does through the TiN layer. By way of example, it has been found that the etch rate of $Cl_2/BCl_3$ through aluminum is about 9,000 angstroms/minute while its etch rate through TiN is only about 2,500 to 3,000 angstroms/minute. The slower TiN etch rate disadvantageously decreases the overall wafer throughput, i.e., fewer wafers can be processed per given unit of time. Further, the slower TiN etch rate decreases the photoresist selectivity since the protective photoresist layer must be exposed to the etching process for a longer period of time.

In view of the foregoing, what is desired is improved methods and apparatus for etching through the titanium-containing layer, such as the TiN ARC layer or the TiN barrier layer, during IC fabrication.

SUMMARY OF THE INVENTION

The invention relates, in one embodiment, to a method for etching a TiN layer of a wafer stack in a plasma processing chamber. The method includes the step of etching at least partially through the TiN layer using a first chemistry, which preferably includes a TiN etchant, a noble gas, and a polymer-forming chemical.

The invention relates, in another embodiment, to an integrated circuit having components formed out of layers of a wafer stack in a plasma processing chamber. The wafer stack includes a TiN layer, and the integrated circuit is formed by etching at least partially through the TiN layer using a first chemistry, which includes a TiN etchant, a noble gas, and a polymer-forming chemical.

The invention relates, in yet another embodiment, to a method for etching through a selected portion of layers of a wafer stack in a plasma processing chamber. The wafer stack includes a TiN anti-reflective coating (ARC) layer, a metallization layer, and a TiN barrier layer. The method includes the step of etching at least partially through the TiN ARC layer of the wafer stack with a first chemistry, which includes a TiN etchant, a noble gas, and a polymer-forming chemical. The method further includes the step of etching at least partially through the metallization layer using a metallization etchant. Additionally, there is included the step of etching at least partially through the TiN barrier layer using the first chemistry.

In a preferred embodiment, the first chemistry in the aforementioned embodiments is $Cl_2/Ar/CHF_3$.

These and other advantages of the present invention will become apparent upon reading the following detailed descriptions and studying the various figures of the drawings.

DETAILED DESCRIPTION OF THE PREFERRED EMBODIMENTS

An invention is described for improved etching through the titanium-containing layer such as the TiN ARC layer or the TiN barrier layer during IC fabrication. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 1:
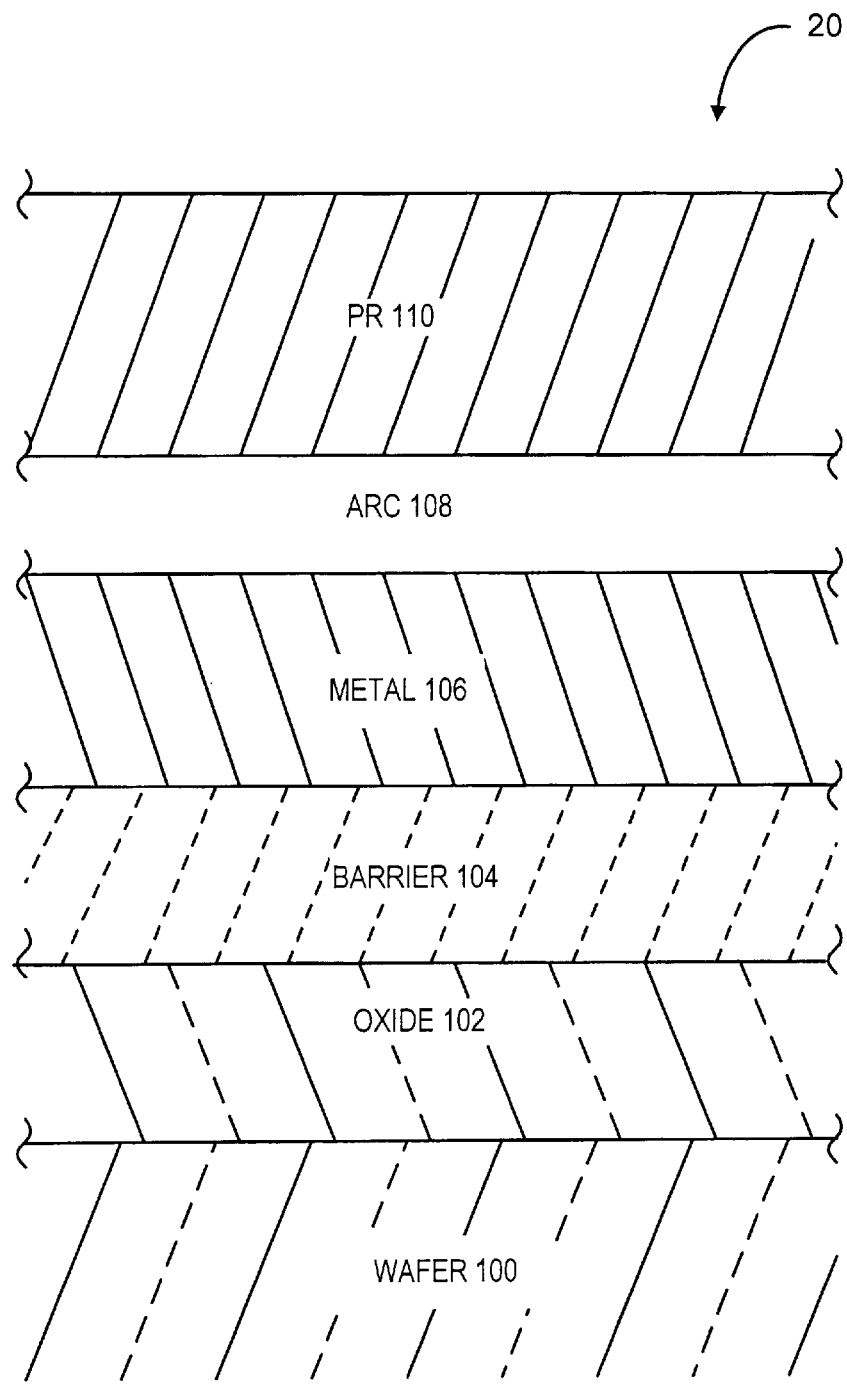
FIG. 1 illustrates a cross-section view of a layer stack, representing the layers formed during the fabrication of a typical semiconductor IC.
Figure 2:
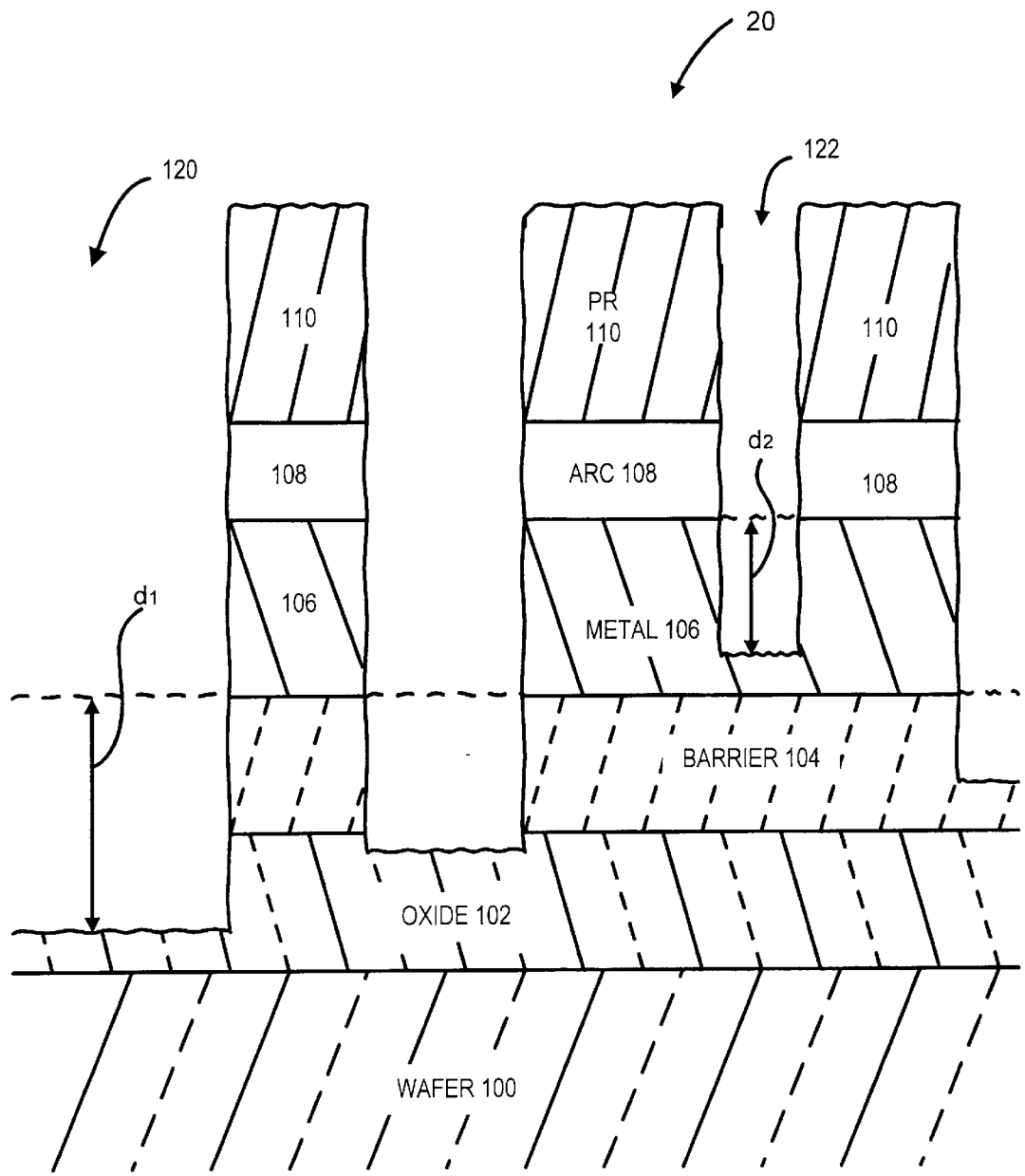
FIG. 2 illustrates a cross-section view of the layer stack of FIG. 1 after conventional etching is completed.

In accordance with one aspect of the present invention, the aforementioned etch rate loading problem is alleviated by etching the layer stack in two steps with two different chemistries. This first chemistry etching step preferably proceeds at least through the TiN ARC layer, e.g., ARC layer 108 of FIG. 1. In addition to the main TiN etchant gas that is employed to etch the aforementioned TiN ARC layer, the first chemistry preferably includes a noble gas and a polymer-forming gas. Thereafter, the layer stack is etched again, albeit with a second chemistry that may be different from the first chemistry. This second chemistry etching step is then preferably allowed to proceed at least partially through the metallization layer, e.g., layer 106 of FIG. 1. The TiN barrier layer may then be etched using either the aforementioned second chemistry or preferably using the aforementioned first chemistry.

The inventive etch process may be performed in any of the known plasma processing apparatuses, including those adapted for dry etching, plasma etching, reactive ion etching (RIE), magnetically enhanced reactive ion etching (MERIE), or the like. To further elaborate, in a typical plasma processing chamber adapted for dry etching, the wafer is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the wafer and etch away at the plasma-contacting layer of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma (TCP™). ECR and TCP™-brand plasma processing systems, among others, are available from Lam Research Corporation of Fremont, Calif.

Figure 3:
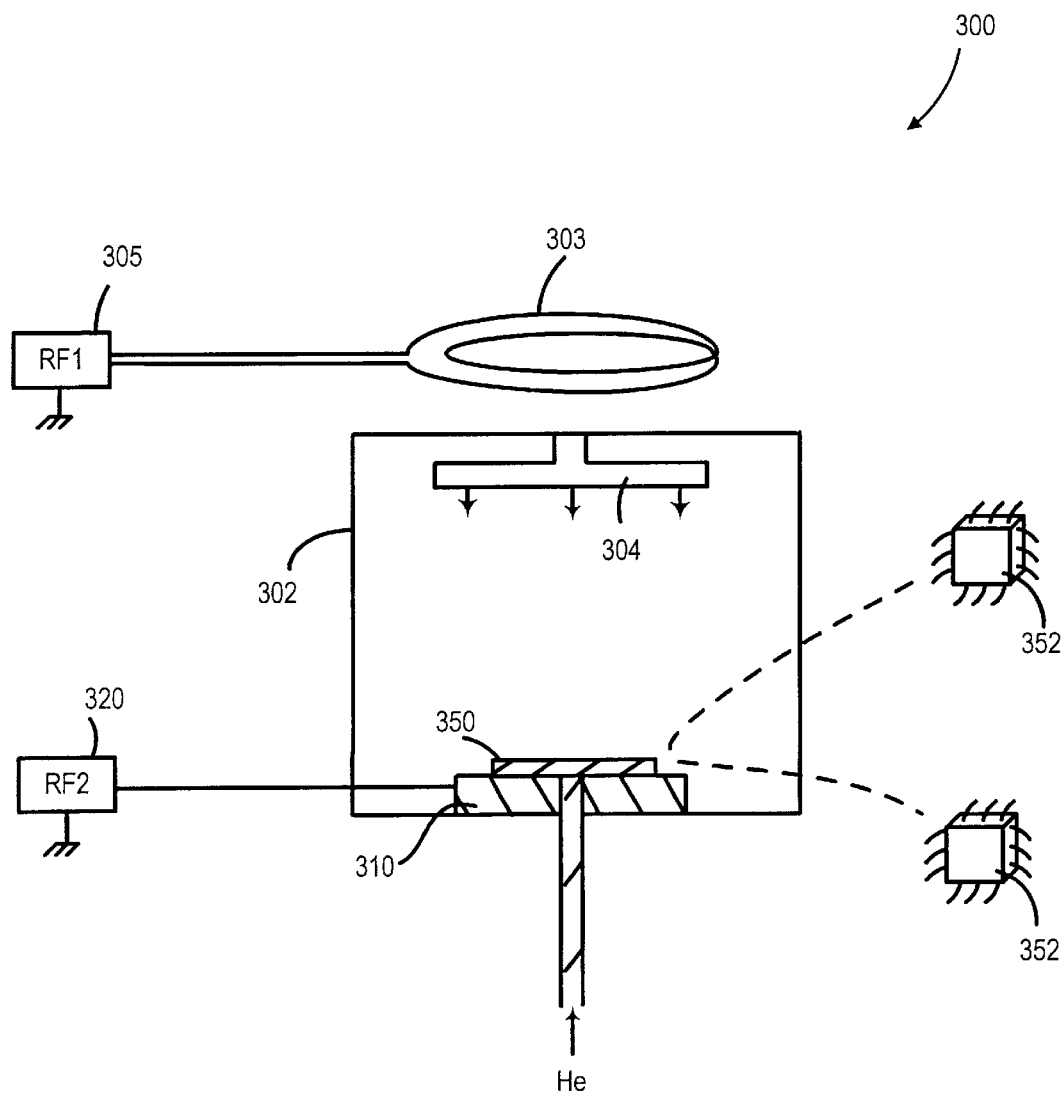
FIG. 3 illustrates a simplified schematic of the TCP™ 9600 SE plasma reactor, representing a suitable plasma processing system for use with the inventive etch process.

In a preferred embodiment, the present invention is employed in a TCP 9600 SE plasma reactor, which is available from Lam Research Corporation, although, as mentioned above, any other conventional and suitable plasma processing systems may well be employed. FIG. 3 illustrates a simplified schematic of the TCP™ 9600 SE plasma reactor, including wafer 350 and integrated circuit chips 352, which are fabricated from dies cut from wafer 350 after the wafer is etched according to the inventive etch technique and processed in conventional post-etch steps. Referring to FIG. 3, a wafer reactor 300 includes a plasma processing chamber 302. Above chamber 302, there is disposed an electrode 303, which is implemented by a coil in the example of FIG. 3. Coil 303 is energized by a RF generator 305 via a matching network (not shown in FIG. 3).

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network). Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low, e.g., between about 8 to 22 mTorr in one embodiment. A plurality of heaters (omitted from FIG. 1 to simplify the illustration) may be provided to maintain a suitable chamber temperature for etching (e.g., about 70° C. in one embodiment). To provide a path to ground, the chamber wall of chamber 302 is typically grounded.

In accordance with one embodiment of the present invention, the titanium containing anti-reflective coating layer of the wafer stack is etched with a first chemistry. Although it is contemplated in this embodiment that the anti-reflective coating layer represent the layer which undergoes etching with the first chemistry, this first chemistry etching step may also be performed, in certain wafer stack structures, on any metallization-overlaying layer, e.g., adhesion layer, seed layer, or the like. As the term is employed herein, a metallization-overlaying layer represents a layer that is disposed above the metallization layer. This overlaying layer may be formed either of TiN or a material that is mainly titanium.

In accordance with this embodiment, etching with the first chemistry preferably terminates when it is determined that the anti-reflective coating layer is etched through. In one embodiment, the anti-reflective coating layer is formed of TiN, and endpoint detection is accomplished by optically monitoring the rise of the 703 nm wavelength in the plasma, which indicates that substantially all the TiN anti-reflective coating layer has been removed. Etching may then terminate immediately. Other conventional methods to determine the termination point for this first chemistry etch step may also be employed.

In accordance with one aspect of the present invention, the first chemistry for a TiN anti-reflective coating layer etch comprises three different gases: a TiN etchant gas, a noble gas, and a polymer-forming gas. More preferably, the TiN etchant gas is clorine ($Cl_2$), and the noble gas may be any one of the group consisting of argon, xenon, krypton, or the like. Most preferably, the first chemistry for a TiN anti-reflective coating layer etch is $Cl_2/Ar/CHF_3$.

Subsequently, the remainder of the layer stack is etched down at least partially through the metallization layer with a second chemistry. For example, the second chemistry may be employed to etch through most of the metallization layer, with the barrier layer underneath being etched with the first chemistry again. The second chemistry is preferably different from the first chemistry because if a polymer creating gas is employed for the bulk etch, e.g., through the aluminum metallization layer, it could result in residues due to the micromasking and may also lower the photoresist selectivity. The use of novel first chemistries (to etch through the ARC layer) that are different from this second chemistry represents a significant feature of the present invention. This is in significant contrast to the prior art wherein the etching is performed with only one chemistry (typically $Cl_2/BCl_3$) to etch through both the TiN ARC layer and the metallization layer.

The inventive approach differs significantly from the prior art two-chemistry approach. In the prior art, a two-chemistry approach is employed when titanium tungsten (TiW) is employed as the ARC layer material, not when titanium nitrate (TiN) is the ARC layer material. To elaborate, the prior art approach employs an $SF_6$ first chemistry to etch away the TiW ARC layer. The remaining layers are then bulk-etched with another chemistry, e.g., $Cl_2/BCl_3$, since $SF_6$ does not etch aluminum well. It should be noted that $SF_6$ is employed in the prior art as the first chemistry for its ability to etch the TiW material, not to reduce etch rate loading. Further, the prior art approach does not involve the addition of a polymer-forming gas to the etchant chemical in the first chemistry since $SF_6$ functions as both the etchant and the polymer-forming gas in the first chemistry.

$SF_6$ also has a high etch rate to photoresist. Consequently, it is typically necessary to employ a thicker photoresist layer when TiW is the ARC layer material in order to adequately protect the underlaying features against the $SF_6$ etchant.

When TiN is employed as the material for the ARC layer, however, the approach in the art has been to employ a single chemistry, e.g., $Cl_2/BCl_3$, for both the TiN ARC layer etch and the bulk etch. This is because the TiN etchant, e.g., the $Cl_2$, does not suffer the photoresist selectivity problem associated with $SF_6$, i.e., $Cl_2$ does not have high etch rate to photoresist as compared to $SF_6$.

The use of a polymer-forming gas in the first chemistry also represents an unobvious feature of the present invention since polymer-forming gases tend to etch away photoresist at a faster rate, i.e., its addition to an etching chemistry reduces photoresist selectivity. The use of a polymer-forming gas in the first chemistry is then contrary to conventional approaches, which strive to increase photoresist selectivity. Since the first chemistry of the present invention, which includes a polymer-forming gas in addition to an etchant chemical, is employed for only a short time and in appropriate quantities to etch through the thin overlaying layer and/or the barrier layer, e.g., the TiN ARC layer and/or the TiN barrier layer, the resulting data does not indicate any undue detrimental results. However, the volume of the polymer creating gas must not be so large, e.g., about 50% or more of the $Cl_2$ flow, as to unduly damage the protective photoresist layer, cause excessive passivation deposition and possibly reverse etch rate loading.

In accordance with one aspect of the present invention, the etch rate loading may be reduced by using a different chemistry in the beginning of the etch (e.g., on the layer overlaying the metallization layer such as the ARC layer) to resolve the etch rate loading issue at this beginning stage. For further details, reference may be made to the commonly-assigned, copending patent application entitled "Methods and Apparatus for Reducing Etch Rate Loading," U.S. patent application Ser. No. 08/601,780 filed on even date and incorporated herein by reference.

In the prior art one-chemistry $Cl_2/BCl_3$ etch, the etch rate loading for a 6-inch wafer and 0.35 micron geometry is found to be about 25%–30%, i.e., the etch rate in the open field regions is about 25%–30% faster than that in the 0.35 micron spacings. Under similar process parameters, the etch rate loading achieved for an etch process that employs $Cl_2/Ar/CHF_3$ as the first chemistry for etching the TiN ARC layer is found to be about 3% and about 2% for the wafer center and the wafer edge respectively.

Due to the reduced etch rate loading, the etching time does not have to be extended to allow the metal layer to be etched through in the narrow spacings. The shorter etching time leads to less damage to the protective photoresist mask regions during bulk etching, thereby improving the ability of the photoresist mask regions to protect the underlying features during etching.

The use of $Cl_2/Ar/CHF_3$ as the first chemistry to etch through the TiN ARC layer advantageously results in improved wafer throughput. This is because the inventive $Cl_2/Ar/CHF_3$ chemistry etches through TiN at a higher rate than does prior art $Cl_2/BCl_3$ chemistry. For example, while the prior art $Cl_2/BCl_3$ chemistry has a TiN etch rate of about 2,500–3,000 angstroms/minute, the inventive $Cl_2/Ar/CHF_3$ etches the TiN layer at over 10,000 angstroms/minute. When the TiN ARC layer etch rate improves, the wafer throughput increases.

It is also observed that when the inventive first chemistry (such as $Cl_2/Ar/CHF_3$) is employed to etch through the TiN ARC layer, less interface notching occurs. Interfacing notching refers to the notch that is sometimes observed at the interface between the ARC layer and the metallization layer when prior art $Cl_2/BCl_3$ chemistry is employed to etch through both. Since interface notching is a deviation from the desired vertical etch side wall, its substantial elimination via the use of the inventive first chemistry, e.g., $Cl_2/Ar/CHF_3$, represents an advantage of the present invention.

Thereafter, the bulk etch may proceed using a conventional second chemistry to etch the remaining layers. The second chemistry itself may include any suitable etchant and bombardment chemicals for etching through the metallization layer. In one embodiment, the second chemistry is any one of the group comprising $Cl_2/BCl_3$, $Cl_2/BCl_3/CHF_3$, $Cl_2/BCl_3/CHF_3$, $Cl_2/BCl_3/HCl$, $Cl_2/BCl_3/N_2$, and $Cl_2/N_2$. By way of example, a mixture of $Cl_2/BCl_3/CHF_3$ having a flow volume ratio of 70:20:10 (in sccm) has been found to be suitable for etching through a metallization layer which comprises an alloy of aluminum having about 0.5%–1% of copper.

Etching with the second chemistry may terminate when the metallization layer is at least partially etched through. In this case, another chemistry may be employed to etch through the remaining of the metallization layer. More preferably, etching with the second chemistry terminates when it is determined that the metallization layer is etched through. In one embodiment, the metallization layer is formed of aluminum or one of its alloys, and endpoint detection is accomplished by optically monitoring the rise of the 261 nm optical wavelength in the plasma, which indicates that substantially all of the aluminum metallization layer has been removed. The second chemistry etch may then terminate immediately or may be allowed to continue for a predetermined period of time, e.g., a few additional seconds, to ensure the complete removal of the metallization layer material.

In one embodiment, the second chemistry etch is extended to etch through the barrier layer. In another embodiment, however, the aforementioned first chemistry may be employed again to etch through the barrier layer. For example, the aforementioned $Cl_2/Ar/CHF_3$ may be used to etch through a TiN barrier layer after the bulk etch step is completed.

The use of the inventive first chemistry to etch through the titanium-containing barrier layer yields several important advantages. For example, when $Cl_2/Ar/CHF_3$ is employed to etch through the TiN barrier layer (after the conventional bulk etch step), the high TiN-to-aluminum selectivity (e.g., up to about 4.6:1 in one case) of $Cl_2/Ar/CHF_3$, as well as its higher TiN etch rate, advantageously results in less undercutting of the aluminum side wall. In contrast, the prior art $Cl_2/BCl_3$ suffers the disadvantages of a slower TiN etch rate and lower selectivity to aluminum. These disadvantageous characteristics of the prior art $Cl_2/BCl_3$ result in a less vertical aluminum profile after etching.

The faster TiN etch rate of the inventive first chemistry, e.g., $Cl_2/Ar/CHF_3$, also results in an increased wafer throughput rate when it is employed to etch through the barrier layer. Further, the use of $Cl_2/Ar/CHF_3$ to etch through the TiN barrier layer also appears to reduce the barrier foot. Barrier foot refers to the presence of the step-like structure in the barrier layer at the foot of the aluminum feature after etching. Barrier foot is sometimes observed in the prior art when $Cl_2/BCl_3$ is employed to etch through both the aluminum metallization layer and the TiN barrier layer in narrow spaces.

Barrier foot is believed to be substantially eliminated by the inventive etch technique due to the fact that the TiN etch rate of the inventive $Cl_2/Ar/CHF_3$ first chemistry (about 10,000 angstroms per minute) more closely matches the aluminum etch rate (i.e., about 9,000 angstroms/minute using $Cl_2/BCl_3$) than does the TiN etch rate of prior art TiN etchant (i.e., about 2,500 to 3,000 angstroms/minute using $Cl_2/BCl_3$). Since a barrier foot represents a deviation in the vertical etch side wall and in the planarity of the trench bottom, its substantial elimination via the use of the inventive $Cl_2/Ar/CHF_3$ represents an advantage of the present invention.

Further, the use of the inventive $Cl_2/Ar/CHF_3$ chemistry also results in less oxide loss during the barrier layer etch. $Cl_2/Ar/CHF_3$ has a TiN-to-oxide selectivity of about 5:1, i.e., it etches through the TiN material about five times as quickly as it does through the oxide material. In contrast, conventional chemistries such as $Cl_2/BCl_3$ has a TiN-to-oxide selectivity of only about 1.5:1 to 2:1. The higher TiN-to-oxide selectivity is especially advantageous in preventing excessive oxide loss in the wide spaces when the barrier etch step is extended to ensure that all barrier layer material, even in the narrow spaces, is removed.

It is speculated that the following mechanisms may be responsible for producing the advantageous etch results discussed herein. There may exist a thin masking photoresist layer lining the bottom of the narrow trenches in the beginning stages of the ARC layer etch. The thin photoresist layer may represent, for example, the photoresist residues left in small geometry spaces after the photoresist patterning step. The residues may be present because although photoresist is adequately removed from the wide areas during photoresist patterning, it may not be completely removed from small geometry spaces. In this case, the presence of a noble gas in the first chemistry, e.g., argon, may enhance the physical etching (i.e., bombardment) of this thin masking layer to allow etching to initiate in the small geometry spaces at about the same time as in the open spaces. Thus, the etch rate loading is advantageously reduced.

The polymer-forming chemical (e.g., $N_2$, $CHF_3$, or the like) is in addition to the chemical that is mainly responsible for etching (e.g., $Cl_2$). In this manner, the first chemistry etches away the overlaying layer (e.g., the TiN ARC layer)

while simultaneously deposits polymer on this overlaying layer. It is believed that the use of a polymer-forming agent in the first chemistry micromasks the wider spacings, i.e., causing masking polymers to be deposited in the wider spacings at a faster rate than in the narrower spacings. Due to the micromasking phenomenon, the etch rate in the wider spacings may be slowed, thereby reducing the difference between the etch rate in the wider spacings and that in the narrower spacings.

The etch rate may be adjusted by appropriately modifying the flow volume ratio of the polymer-forming agent. By way of example, increasing the ratio of the flow volume of the polymer-forming agent tends to reduce the etch rate due to the increase in polymer deposition during etching.

It is also believed that the presence of a noble gas, e.g., argon, enhances the dissociation of $Cl_2$ into $Cl^+$ reactive species. When there are more reactive species, etching occurs at a higher rate. It is also believed that the presence of a noble gas, e.g., argon, causes the passivation polymer, which is formed on the aluminum side wall during, for example, the barrier etch step, to increase its repellent to the $Cl^+$ reactive species, thereby reducing the affinity of these $Cl^+$ species for the aluminum side wall. Consequently, the $Cl^+$ reactive species migrate more readily downward toward the trench bottom to etch the barrier layer more anisotropically and with a higher etch rate.

Another possible explanation involves the ability of the noble gas, e.g., argon, to change the surface diffusion of the $Cl_+$ reactive species to allow these species to migrate downward toward the bottom of the trench more readily instead of clinging to the aluminum side wall.

Figure 4:
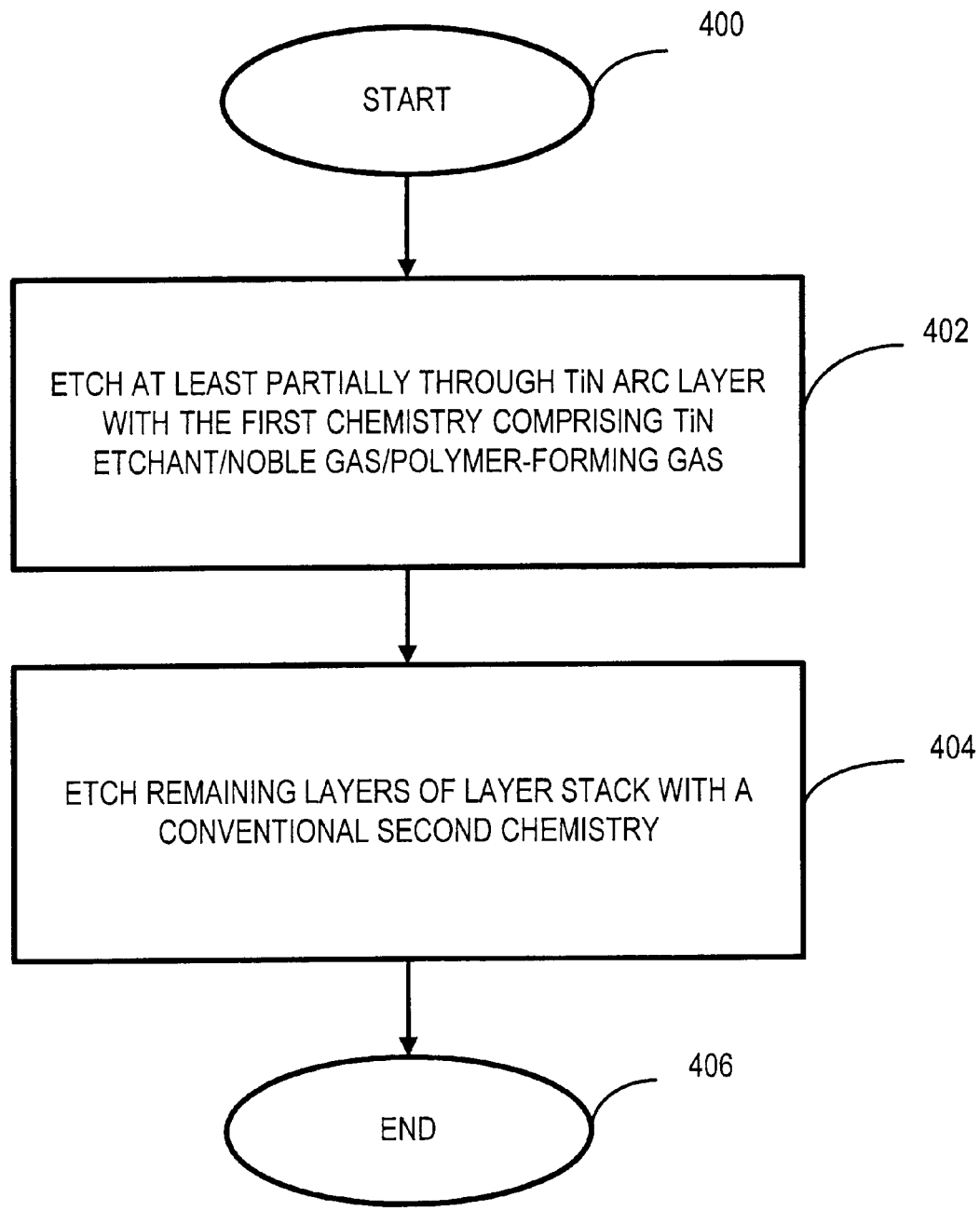
FIG. 4 shows, in accordance with one embodiment of the present invention, the inventive etching technique wherein the inventive first chemistry is employed to etch through the TiN ARC layer.

FIG. 4 shows, in accordance with one embodiment of the present invention, the inventive etching technique wherein the inventive first chemistry is employed to etch through the TiN ARC layer. It should be understood that prior to employing the inventive etch techniques disclosed herein, the wafer may have to be prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 402, the TiN ARC layer is at least partially etched using the inventive first chemistry. The first chemistry is preferably a TiN etchant/noble gas/polymer-forming gas combination to etch through the TiN ARC layer. More preferably, the first chemistry represents $Cl_2/Ar/CHF_3$ to etch through the TiN ARC layer, and the metallization layer comprises essentially of aluminum. In step 404, the remaining layers of the layer stack, including the metallization layer and the barrier layer, are etched with a conventional chemistry, e.g., $Cl_2/BCl_3$.

Figure 5:
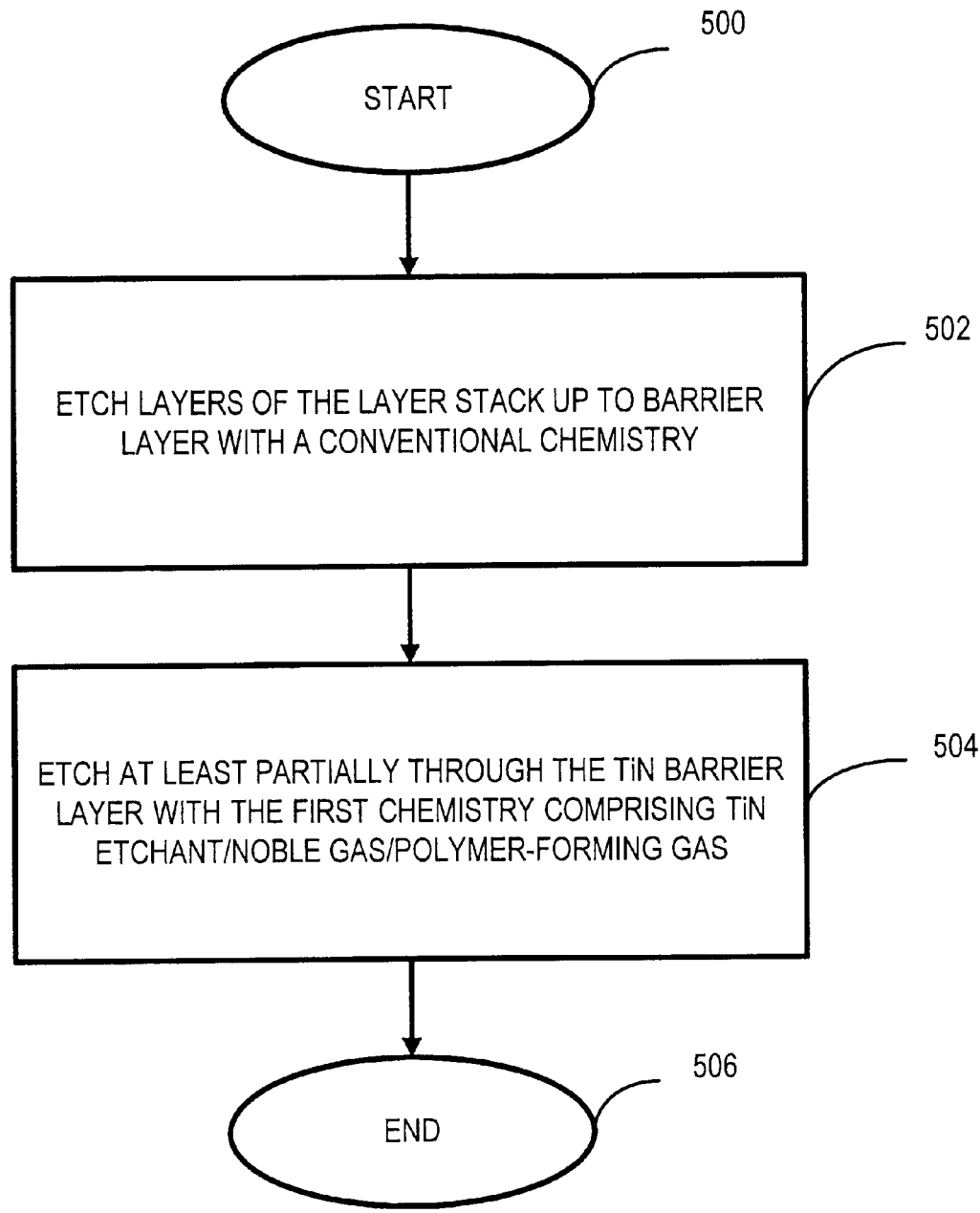
FIG. 5 shows, in accordance with another embodiment of the present invention, the inventive etching technique wherein the inventive first chemistry is employed to etch through the TiN barrier layer.

FIG. 5 shows, in accordance with another embodiment of the present invention, the inventive etching technique wherein the inventive first chemistry is employed to etch through the TiN barrier layer. In step 502, a conventional chemistry, e.g., $Cl_2/BCl_3$, is employed to etch through both the ARC layer and the metallization layer. In step 504, the inventive first chemistry is employed to etch at least partially through the TiN barrier layer. The first chemistry is preferably a TiN etchant/noble gas/polymer-forming gas combination to etch through the TiN barrier layer. More preferably, the first chemistry represents $Cl_2/Ar/CHF_3$ to etch completely through the TiN barrier layer.

Figure 6:
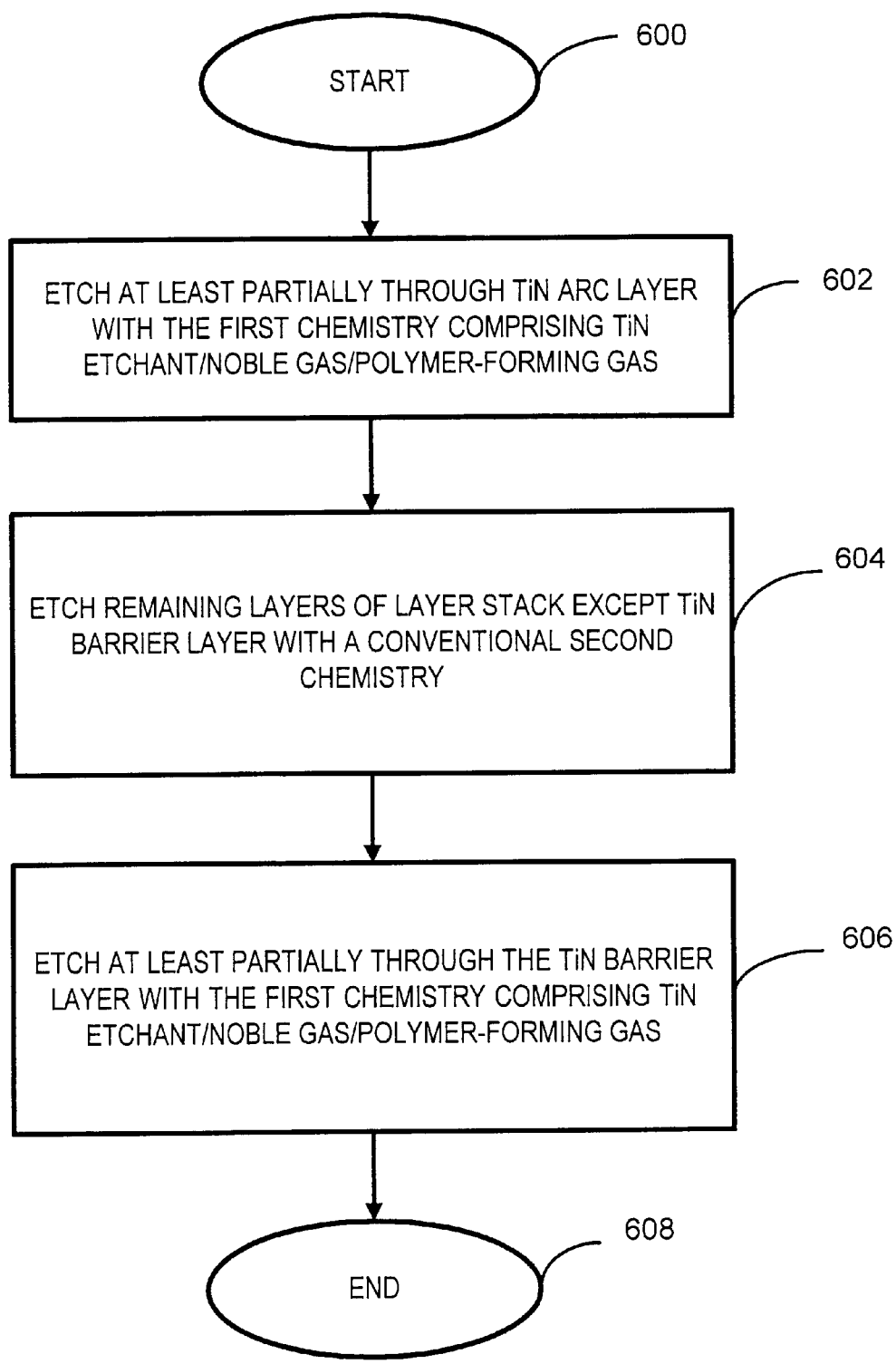
FIG. 6 shows, in accordance with yet another embodiment of the present invention, the inventive etching technique wherein the inventive chemistry is employed to etch through both the TiN ARC layer and the TiN barrier layer.

FIG. 6 shows, in accordance with yet another embodiment of the present invention, the inventive etching technique wherein the inventive chemistry is employed to etch through both the TiN ARC layer and the TiN barrier layer. In step 602, which is analogous to step 402 of FIG. 4, the TiN ARC layer is etched with the first chemistry. In step 604, the bulk of the layer stack, including the metallization layer (but excepting the TiN barrier layer), is etched through using a conventional chemistry, e.g., $Cl_2/BCl_3$. In step 606, the TiN barrier layer is etched using the first chemistry. This step 606 is analogous to step 504 of FIG. 5.

Following the inventive etch process of either FIG. 4, 5, or 6, the wafer may undergo additional post-etch processing steps that are conventional in nature. Thereafter, the finished wafer may be cut into dies, which may then be made into IC chips. The resulting IC chip, e.g., IC chips 352 of FIG. 3, may then be l incorporated in an electronic device, e.g., any of the of well known commercial or consumer electronic devices, including digital computers.

By way of example, Table 1 below shows the approximate process parameters that may be suitable for the $Cl_2/Ar/CHF_3$ first chemistry etch of a 6' wafer in a TCP™ 9600 SE plasma reactor. In this example, the metallization-overlaying layer is a TiN anti-reflection layer, which overlays an aluminum layer containing approximately 0.5% copper. In the table below, an approximate suitable range, an approximate preferred range, and an approximate more preferred range of the top electrode power (in watts), bottom electrode power (in watts), and flow rates (in percentage of total etchant source flow rate unless otherwise specified) are shown. Other parameter values that may be helpful for the etch will be readily apparent to those skilled in the art, whether for the same wafer and anti-reflection layer or other wafers and anti-reflection layers.

TABLE 1

| FIRST CHEMISTRY | | TOP POWER | BOTTOM POWER | FLOW RATE | | |
|---|---|---|---|---|---|---|
| | Range | 350–650 | 100–350 | 30 sccm–110 sccm $Cl_2$ | 12.5%–30% (of $Cl_2$ flow) $CHF_3$ | 19%–50% (of $Cl_2$ flow) Ar |
| $CL_2/Ar/CHF_3$ | Preferred Range | 400–600 | 120–200 | 35 sccm–80 sccm $Cl_2$ | 15%–25% (of $Cl_2$ flow) $CHF_3$ | 25%–40% (of $Cl_2$ flow) Ar |
| | More Preferred Range | 560 | 140 | 40 sccm $Cl_2$ | 17.5% (of $Cl_2$ flow) $CHF_3$ | 37.5% (of $Cl_2$ flow) Ar |

While this invention has been described in terms of several preferred embodiments, there are alterations, permutations, and equivalents which fall within the scope of this invention. For example, although the inventive chemsistry, e.g., $Cl_2/Ar/CHF_3$, is particularly suitable for etching the TiN ARC and/or barrier layers, it should be kept in mind that the first chemistry may be employed to etch any TiN layer of the wafer stack. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching a wafer stack, said wafer stack comprising a given layer, an aluminum-containing layer and a TiN barrier layer, said given layer representing one of a first layer that consists essentially of TiN and a second layer that consists essentially of Ti, said given layer being disposed above said aluminum-containing layer, said aluminum-containing layer being disposed above said TiN barrier layer, said method comprising:

etching at least partially through said given layer using a first chemistry, said first chemistry comprising an etchant configured for etching said given layer, a noble gas, and a polymer-forming chemical, said polymer-forming chemical being one of $N_2$ and $CHF_3$;

etching at least partially through said aluminum-containing layer using a second chemistry different from said first chemistry; and etching at least partially through said TiN barrier layer using said first chemistry.

2. The method of claim 1 wherein said given layer represents said first layer.

3. The method of claim 2 wherein said etchant is $Cl_2$.

4. The method of claim 3 wherein said noble gas is argon.

5. The method of claim 4 wherein said polymer-forming chemical is $CHF_3$.

6. The method of claim 2 wherein said noble gas is argon.

7. The method of claim 6 wherein said polymer-forming chemical is $CHF_3$.

8. The method of claim 2 wherein said polymer-forming chemical is $CHF_3$.

9. The method of claim 1 wherein said given layer is said first layer, said etchant is $Cl_2$, said noble gas is argon, and said polymer-forming chemical is $CHF_3$.

10. In a plasma processing chamber, a method for etching through a selected portion of layers of a wafer stack, said wafer stack comprising a TiN anti-reflective coating (ARC) layer, a metallization layer and a TiN barrier layer, said TiN ARC layer being disposed above said metallization layer, said metallization layer being disposed above said TiN barrier layer said method comprising:

etching at least partially through said TiN ARC layer of said wafer stack with a first chemistry, said first chemistry comprising a TiN etchant, a noble gas, and a polymer-forming chemical, said polymer-forming chemical being one of $N_2$ and $CHF_3$;

etching at least partially through said metallization layer using a second chemistry different from said first chemistry and etching at least partially through said TiN barrier layer using said first chemistry.

11. The method of claim 10 wherein said TiN etchant is $Cl_2$.

12. The method of claim 11 wherein said noble gas is argon.

13. The method of claim 12 wherein said polymer-forming chemical is $CHF_3$.

14. The method of claim 13 wherein said metallization layer represents an aluminum-containing layer.

15. The method of claim 1 wherein said second chemistry is configured to etch through said aluminum-containing layer at a faster etch rate than an etch rate achievable by said first chemistry.

16. The method of claim 15 wherein said second chemistry comprises $Cl_2/BCl_3$.

17. A method for forming an integrated circuit, said method including:

providing a substrate having thereon a given layer, a metallization layer and a TiN barrier layer, said metallization layer being disposed below said given layer, said TiN barrier layer being disposed below said metallization layer, said given layer representing one of a first layer that consists essentially of TiN and a second layer that consists essentially of TI etching at least partially through said given layer using a first chemistry, said first chemistry comprising $Cl_2$, a noble gas, and $CHF_3$;

subsequently etching at least partially through said metallization layer with a second chemistry different from said first chemistry; and etching at least partially through said TiN barrier layer with said first chemistry.

18. The method of claim 17 wherein said second chemistry is configured to etch through said metallization layer at a faster etch rate than an etch rate achievable by said first chemistry.

19. The method of claim 17 wherein said metallization layer represents an aluminum-containing layer.

20. The method of claim 19 wherein said given layer is said first layer, said second chemistry comprises $Cl_2/BCl_3$.

21. The method of claim 20 wherein said noble gas is Ar.

* * * * *